(12) United States Patent
Kim et al.

(10) Patent No.: US 9,490,229 B2
(45) Date of Patent: Nov. 8, 2016

(54) SEMICONDUCTOR DEVICE CONNECTED BY ANISOTROPIC CONDUCTIVE FILM

(71) Applicant: SAMSUNG SDI CO., LTD., Yongin-si, Gyeonggi-do (KR)

(72) Inventors: Ji Yeon Kim, Suwon-si (KR); Kyoung Ku Kang, Suwon-si (KR); Kyoung Soo Park, Suwon-si (KR); Byeong Geun Son, Suwon-si (KR); Young Ju Shin, Suwon-si (KR); Kwang Jin Jung, Suwon-si (KR); Ja Young Hwang, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/527,181

(22) Filed: Oct. 29, 2014

(65) Prior Publication Data

US 2015/0123292 A1 May 7, 2015

(30) Foreign Application Priority Data

Oct. 31, 2013 (KR) .................... 10-2013-0131304

(51) Int. Cl.
  *H01L 23/00* (2006.01)
  *C09J 163/00* (2006.01)
  *H05K 3/32* (2006.01)

(52) U.S. Cl.
  CPC ............ *H01L 24/29* (2013.01); *C09J 163/00* (2013.01); *H01L 24/27* (2013.01); *H01L 24/81* (2013.01);
  (Continued)

(58) Field of Classification Search
  CPC ............ H01L 24/29; H01L 2224/29083; H01L 24/27; H01L 24/81; H01L 24/83; H01L 2224/271; H01L 2224/2939; H01L 2224/29455; H01L 2224/29439; H01L 24/13; H01L 24/16; H01L 2924/15788; H01L 24/32; H01L 2224/2919; H01L 2924/0665; H01L 2224/2929; H01L 2224/29387; H01L 2924/053; H01L 2924/05442; H01L 2224/29344; H01L 2924/00014; H01L 2224/29339; H01L 2924/00; H01L 2224/29347; H01L 2224/29355; H01L 2224/32145; H01L 2224/32225; H01L 2224/81193; H01L 2224/83101; H01L 2224/83204; H01L 2224/83851; H01L 2224/83862; C09J 163/00; H05K 3/323

See application file for complete search history.

(56) References Cited

U.S. PATENT DOCUMENTS 6,174,175 B1 * 1/2001 Behfar ................ H01R 12/714
                                                          439/91
2010/0327232 A1   12/2010 Yamamoto et al.
2013/0154095 A1 *  6/2013 Yu ..................... H01L 24/29
                                                          257/746

FOREIGN PATENT DOCUMENTS

CN        1217737 A       5/1999
CN      104513632 A       4/2015

(Continued)

OTHER PUBLICATIONS

Gao, et al. "Study on Tensile Mechanical Behaviors for Anisotropic Conductive Adhesive Film" Scientific Journal of Microelectronics vol. 2 No. 1 (2012).

(Continued)

*Primary Examiner* — Roy Potter
(74) *Attorney, Agent, or Firm* — Lee & Morse, P.C.

(57) ABSTRACT

Provided is a semiconductor device, including an anisotropic conductive film connecting the semiconductor device, the anisotropic conductive film having a maximum stress of 0.4 kgf/mm² or more; and a stress-strain curve having a slope (A) of greater than 0 and less than or equal to 0.2 kgf/(mm²·%) as represented by the following equation 1:

$$\text{slope}(A) = (\tfrac{1}{2}S_{max} - S_0)/x \quad (1),$$

wherein:
  $S_{max}$=maximum stress,
  x=strain (%) at half (½) of the maximum stress, and
  $S_0$=stress at a strain of 0.

17 Claims, 4 Drawing Sheets

(52) U.S. Cl.
CPC ............... *H01L 24/83* (2013.01); *H05K 3/323* (2013.01); *H01L 24/13* (2013.01); *H01L 24/16* (2013.01); *H01L 24/32* (2013.01); *H01L 2224/13023* (2013.01); *H01L 2224/16148* (2013.01); *H01L 2224/16238* (2013.01); *H01L 2224/271* (2013.01); *H01L 2224/27003* (2013.01); *H01L 2224/293* (2013.01); *H01L 2224/2919* (2013.01); *H01L 2224/2929* (2013.01); *H01L 2224/2939* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29387* (2013.01); *H01L 2224/29439* (2013.01); *H01L 2224/29444* (2013.01); *H01L 2224/29455* (2013.01); *H01L 2224/32145* (2013.01); *H01L 2224/32225* (2013.01); *H01L 2224/81193* (2013.01); *H01L 2224/81903* (2013.01); *H01L 2224/83101* (2013.01); *H01L 2224/83204* (2013.01); *H01L 2224/83851* (2013.01); *H01L 2224/83862* (2013.01); *H01L 2924/07811* (2013.01); *H01L 2924/15788* (2013.01)

(56) References Cited

FOREIGN PATENT DOCUMENTS

| JP | 1995-009821 A | 10/1994 |
|---|---|---|
| JP | 2010-248386 A | 11/2010 |
| TW | 201226518 A1 | 7/2012 |
| TW | 201229185 A1 | 7/2012 |

OTHER PUBLICATIONS

Chinese Office Action dated Mar. 31, 2016 in Corresponding Chinese Patent Application No. 201410602261.0.
Taiwanese Office Action dated Mar. 31, 2016 in Corresponding Taiwanese Patent Application No. 103137713.

\* cited by examiner

SEMICONDUCTOR DEVICE CONNECTED BY ANISOTROPIC CONDUCTIVE FILM

CROSS-REFERENCE TO RELATED APPLICATION

Korean Patent Application No. 10-2013-0131304, filed on Oct. 31, 2013, in the Korean Intellectual Property Office, and entitled: "Semiconductor Device Connected by Anisotropic Conductive Film," is incorporated by reference herein in its entirety

FIELD

Provided is a semiconductor device connected by an anisotropic conductive film.

DESCRIPTION OF THE RELATED ART

Anisotropic conductive films (ACFs) may refer to film-shaped adhesives prepared by dispersing conductive particles in a resin such as an epoxy resin. An anisotropic conductive film may be composed of polymer layers having electric anisotropy and adhesion, and may exhibit conductive properties in the thickness direction of the film and insulating properties in the surface direction thereof.

SUMMARY

Embodiments may be realized by providing a semiconductor device including an anisotropic conductive film, the anisotropic conductive film having a maximum stress of 0.4 kgf/mm² or more; and a stress-strain curve having a slope (A) of greater than 0 and less than or equal to 0.2 kgf/(mm²·%) as represented by the following equation 1:

$$\text{slope}(A) = (\tfrac{1}{2}S_{max} - S_0)/x \qquad (1),$$

wherein:
$S_{max}$=maximum stress,
x=strain (%) at half (½) of the maximum stress, and
$S_0$=stress at a strain of 0.

The anisotropic conductive film may have a strain (D) of 10% or more upon fracture of a sample thereof.

The anisotropic conductive film may include a first insulation layer, a conductive layer, and a second insulation layer.

The first insulation layer may be stacked on one surface of the conductive layer and the second insulation layer may be stacked on the other surface of the conductive layer.

The first insulation layer may have a thickness of 2 μm or less.

The conductive layer may have a thickness of 2 μm to 10 μm and the second insulation layer may have a thickness of 6 μm to 18 μm.

The second insulation layer may have a melt viscosity at 50° C. to 60° C. from 10,000 Pa·s to 70,000 Pa·s, as measured by an ARES rheometer.

The second insulation layer may include a binder resin, an epoxy resin, inorganic particles, a curing agent, and a coupling agent.

The second insulation layer may include: 10 wt % to 50 wt % of the binder resin; 10 wt % to 60 wt % of the epoxy resin; 5 wt % to 40 wt % of the inorganic particles; 0.5 wt % to 10 wt % of the curing agent; and 0.1 wt % to 10 wt % of the coupling agent based on a total weight of the second insulation layer in terms of solid content.

In the second insulation layer, the content of the epoxy resin may be higher than the content of the binder resin based on a total weight of the second insulation layer in terms of solid content, and a weight ratio of the epoxy resin to the binder resin may be higher than 1:1 and less than or equal to 2:1.

The binder resin may include a first binder resin having a glass transition temperature (Tg) of 90° C. or higher and a second binder resin having a glass transition temperature from 60° C. to less than 90° C.

The first binder resin may be present in a greater amount than the second binder resin, and a weight ratio of the first binder resin to the second binder resin may range from 1:0.2 to less than 1:1.

The first binder resin may be present in a smaller amount than the second binder resin, and a weight ratio of the first binder resin to the second binder resin may range from 1:4 to 1:10.

The anisotropic conductive film may have an connection resistance of 0.5Ω or less, as measured at 25° C. immediately after pre-compressing the anisotropic conductive film placed between a glass substrate and an Integrated Circuit (IC) driver chip or an IC chip at 50 to 70° C. under a load of 1 to 3 MPa for 1 to 3 seconds and compressing at 140° C. to 160° C. under a load of 60 MPa to 80 MPa for 3 to 7 seconds.

The anisotropic conductive film may have a post-reliability testing connection resistance of 5Ω or less, as measured after the anisotropic conductive film is subjected to the pre-compression and the compression, and left at 85° C. and 85% RH for 500 hours.

The anisotropic conductive film may have a melt viscosity at 50° C. to 60° C. from 20,000 Pa·s to 100,000 Pa·s, as measured by an ARES rheometer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

Hereinafter, embodiments will be described in more detail. Descriptions of details apparent to those skilled in the art will be omitted for clarity.

Figure 1:
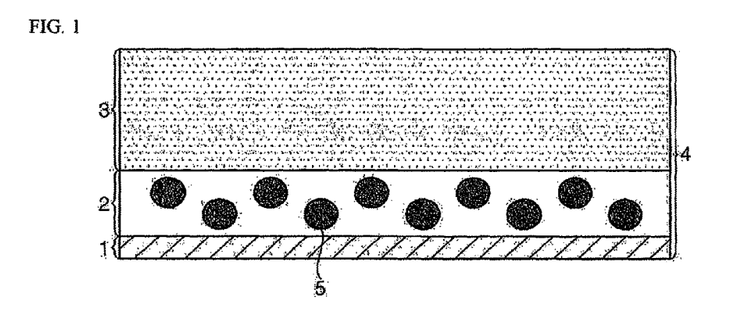
FIG. 1 illustrates a sectional view of an anisotropic conductive film connecting a semiconductor device according to an embodiment.

FIG. 1 illustrates a sectional view of an anisotropic conductive film 4 of a tri-layer structure connecting a semiconductor device according to an embodiment.

According to an embodiment, the anisotropic conductive film 4 may have a multilayer structure of tri- or higher layers. For example, the anisotropic conductive film 4 may have a tri-layer structure that includes a first insulation layer 1, a conductive layer 2, and a second insulation layer 3, or the first insulation layer 1 may be stacked on one surface of a conductive layer 2 containing conductive particles 5 and the second insulation layer 3 may be stacked on the other surface thereof.

In the anisotropic conductive film 4 according to an embodiment, the insulation layers 1, 3 not containing the conductive particles 5 may be respectively formed on both surfaces of the conductive layer 2 containing the conductive particles 5 for electrical connection, and insulating properties may be imparted to the anisotropic conductive film without obstructing compression of the conductive particles 5 upon compression of the film. Each of the insulation layers may be composed of a single layer instead of a bilayer structure in the related art, and may achieve sufficient filling of a space between terminals with the insulation layers.

As used herein, the term "stack" means that a certain layer is formed on one surface of another layer, and may be used interchangeably with coating or lamination.

The first insulation layer 1 may have a thickness of 2 μm or less, the conductive layer 2 may have a thickness of 2 μm to 10 μm, and the second insulation layer 3 may have a thickness of 6 μm to 18 μm. For example, the first insulation layer 1 may have a thickness of 1 μm or less, the conductive layer 2 may have a thickness of 2 μm to 8 μm, and the second insulation layer 3 may have a thickness of 6 μm to 16 μm; or the conductive layer 2 may have a thickness of 2.5 μm to 6 μm, and the second insulation layer 3 may have a thickness of 7 μm to 15 μm.

The first insulation layer 1 of the anisotropic conductive film according to an embodiment may have a thickness of 2 μm or less, for example, 1 μm or less, the anisotropic conductive film may facilitate pre-compression while securing sufficient conductivity, reduce detachment after curing, secure cohesion to the substrate, improve connection reliability, and improve reliability of a semiconductor device.

A stress-strain curve before pre-compression may be obtained using the anisotropic conductive film according to an embodiment and may be used to facilitate pre-compression processability and primary compression processability based on properties of the anisotropic conductive film before pre-compression.

As used herein, the term "stress-strain curve" may be used interchangeably with other terms such as stress-strain diagram or stress-distortion curve, and may be obtained by measuring a load applied to a specimen of a material and the degree of deformation.

Next, the stress-strain curve will be described with reference to FIG. 2. In the stress-strain curve, the elastic region refers to a portion showing a linear stress-strain relationship up to a yield point, in which the slope of the curve represented by a linear equation is referred to as the modulus of elasticity (E) or Young's modulus. As the specimen of the material continues to be deformed, stress increases up to maximum stress, for example, due to deformation hardening.

Figure 2:
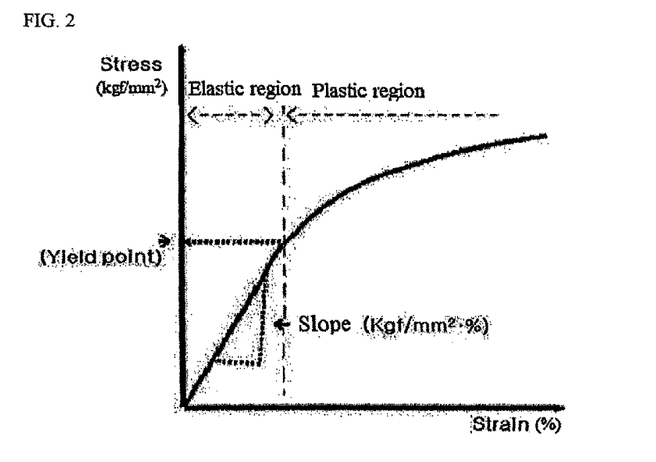
FIG. 2 illustrates a diagram of a stress-strain curve.

In FIG. 2, the yield point means a limit point at which the elastic region is converted into a plastic region, an area under the stress-strain curve indicates toughness of the material, and a triangular area of the elastic region in the curve indicates resilience of the material. In actual stress-strain curves, a fracture point may appear before or near the yield point, and the height of the yield point or the shape of the curves varies depending upon the kind of material.

Figure 3:
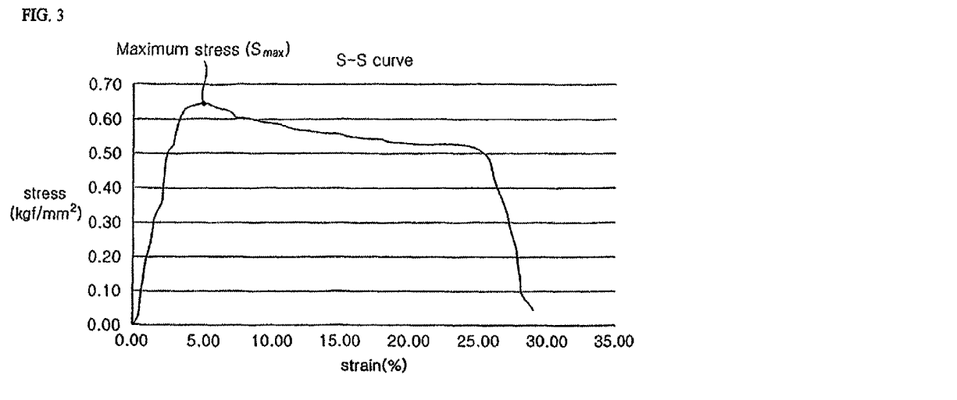
FIG. 3 illustrates a stress-strain curve of an anisotropic conductive film prepared in Example 2.

FIG. 3 illustrates a stress-strain curve of an anisotropic conductive film according to an embodiment.

The stress-strain curve of the anisotropic conductive film may be obtained, for example, by the following method. For example, with film specimens cut to a size of, for example, 2 mm×10 mm, by hand slitting and mounted on a universal testing machine (UTM, H5KT, Hounsfield), tensile strength of the film specimen was measured twice for each specimen.

For example, the stress-strain curve may be obtained by plotting the strain (%) on the x-axis and the stress (kgf/mm$^2$) on the y-axis, such that a certain point on the curve may be indicated by (x, y) coordinates.

Figure 4:
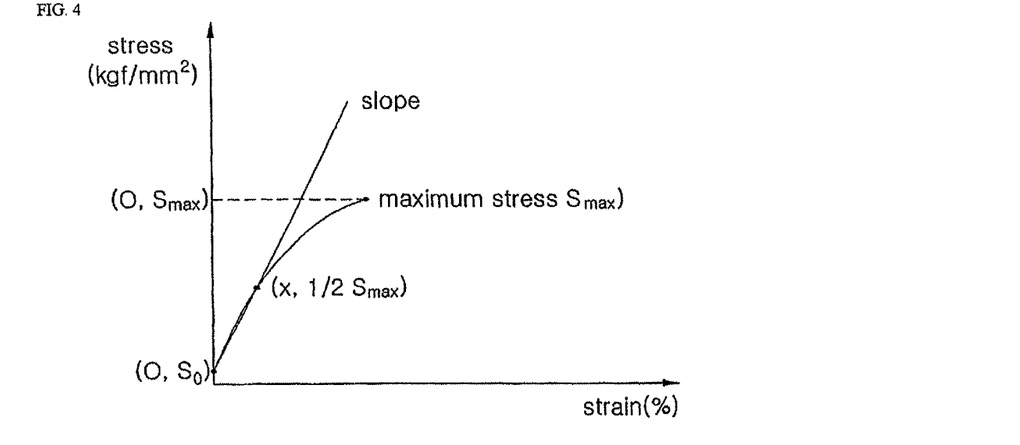
FIG. 4 illustrates a graph depicting a slope A and maximum stress ($S_{max}$) of an anisotropic conductive film according to an embodiment.

Next, referring to FIG. 4, the slope (A) of the stress-strain curve and maximum stress ($S_{max}$) will be described.

In an embodiment, the slope (A, unit: kgf/(mm$^2$·%)) of the stress-strain curve indicates variation from coordinates (x, ½ $S_{max}$) indicating 50% of maximum stress ($S_{max}$) to coordinates (0, $S_0$) at a strain of 0, and may be calculated by Equation 1, $$\text{Slope}(A, \text{unit:kgf}/(\text{mm}^2 \cdot \%)) = (½ S_{max} - S_0)/x \tag{1}$$

wherein $S_{max}$: maximum stress, x: strain (%) at half (½) of the maximum stress, and $S_0$: stress at a strain of 0.

In the stress-strain curve of the anisotropic conductive film according to an embodiment, the slope (A) is measured before curing of the anisotropic conductive film and relates to pre-compression properties or initial properties of the anisotropic conductive film before curing.

$S_0$ is stress when strain is 0, and $S_0$ may be 0.

In the stress-strain curve, the maximum stress ($S_{max}$) indicates the highest value of stress and means a limitation of stress caused by deformation of the film.

In one example, the slope (A) and maximum stress ($S_{max}$) of the stress-strain curve may be measured before curing of the anisotropic conductive film, and may be adjusted based on the thickness of each layer, components of a film composition, and amounts thereof.

According to an embodiment, the stress-strain curve of the anisotropic conductive film may have a slope (A) of greater than 0 and less than or equal to 0.2 kgf/(mm$^2$·%), as represented by the following equation 1, and a maximum stress ($S_{max}$) of 0.4 kgf/mm$^2$ or more.

For example, the slope (A) may range from 0.05 kgf/(mm$^2$·%) to 0.2 kgf/(mm$^2$. %) and the maximum stress may be 0.5 kgf/mm$^2$ or more; or the slope (A) may range from 0.1 kgf/(mm$^2$. %) to 0.2 kgf/(mm$^2$. %) and the maximum stress ($S_{max}$) may range from 0.5 kg f/mm$^2$ to 1.0 kgf/mm$^2$, $$\text{Slope}(A, \text{unit:kgf}/(\text{mm}^2 \cdot \%)) = (½ S_{max} - S_0)/x \tag{1}$$

wherein $S_{max}$: maximum stress, x: strain (%) at half (½) of the maximum stress, $S_0$: stress at a strain of 0.

By adjusting the slope (A) and maximum stress ($S_{max}$) of the stress-strain curve of the anisotropic conductive film within the aforementioned ranges, it may be possible to control pre-compression properties of the anisotropic conductive film. For example, the slope (A) and the maximum stress ($S_{max}$) may indicate initial properties of the film upon pre-compression, for example, stress, hardness, and elastic modulus, the anisotropic conductive film may reduce pre-compression failure by adjusting the slope (A) and the maximum stress within the aforementioned ranges, may prevent elongation upon pre-compression and improve reliability, and may facilitate adjustment of primary compression processability without fracture.

By adjusting the slope (A) and the maximum stress ($S_{max}$) within the aforementioned ranges, the anisotropic conductive film may have improved initial connection resistance after curing and post-reliability testing connection resistance under high temperature/high humidity conditions, and improved connection reliability may be secured.

In the stress-strain curve according to the an embodiment, strain (D) upon fracture of the specimen may be 10% or more, for example, 20% or more, for example, 25% or more.

Within this range of strain, the anisotropic conductive film allows stable pre-compression without crumbling or fracture.

The anisotropic conductive film according to an embodiment may have a melt viscosity at 50° C. to 60° C. from 20,000 Pa·s to 100,000 Pa·s, for example, from 20,000 Pa·s to 80,000 Pa·s, for example, from 20,000 Pa·s to 60,000 Pa·s, or from 20,000 Pa·s to 50,000 Pa·s, as measured by an ARES rheometer.

In an embodiment, pre-compression of the anisotropic conductive film may be performed at 50° C. to 60° C., and flowability of the anisotropic conductive film may be controlled within the melt viscosity range of the anisotropic conductive film at 50° C. to 60° C., and the pre-compression process may be facilitated.

The melt viscosity of the anisotropic conductive film according to an embodiment may be adjusted according to the thickness of the conductive film as well as the components of the film composition and amounts thereof.

For example, the melt viscosity of the anisotropic conductive film depends on a second insulation layer that may be the thickest layer of the anisotropic conductive film. For example, the second insulation layer of the anisotropic conductive film according to an embodiment may have a melt viscosity at 50° C. to 60° C. from 10,000 Pa·s to 70,000 Pa·s, from 10,000 Pa·s to 60,000 Pa·s, for example, from 10,000 Pa·s to 40,000 Pa·s; or from 20,000 Pa·s to 38,000 Pa·s, for example, from 22,000 Pa·s to 38,000 Pa·s, as measured by an ARES rheometer.

Within these ranges, the melt viscosity of the overall anisotropic conductive film may be adjusted, and the anisotropic conductive film may exhibit sufficient adhesion and may be evenly compressed on a glass substrate, and pre-compression properties may be improved. The anisotropic conductive film may have improved film properties, pre-compression failure may be reduced and the insulation layer may sufficiently fill spaces between terminals, and connection reliability may be improved.

Figure 5:
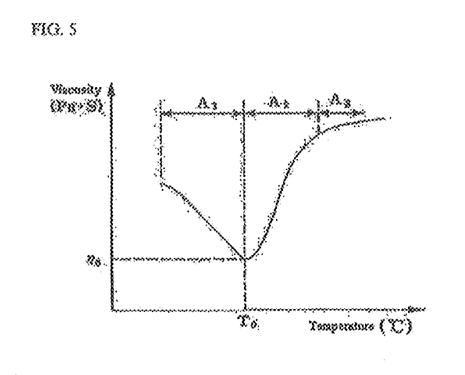
FIG. 5 illustrates a graph depicting a method for measuring melt viscosity of a second insulation layer at a certain temperature using an ARES rheometer.

An adhesive may be heated, and viscosity of the adhesive may gradually decrease, for example, due to temperature increase in an initial zone ($A_1$ zone). Upon reaching a certain time point ($T_0$), the adhesive may be melted and exhibit the lowest viscosity ($\eta_0$). Then, the temperature of the adhesive may be further increased, and curing of the adhesive may be carried out ($A_2$ zone), and viscosity of the adhesive may be gradually increased. Then, curing may be completed ($A_3$ zone), and the viscosity of the adhesive may be generally maintained in a constant level. As used herein, the melt viscosity of the second insulation layer at 50° C. to 60° C. as measured by an ARES rheometer may be adjusted according to the ratio of resins and/or the composition ratio, and may be adjusted by additionally providing inorganic particles.

The anisotropic conductive film according to an embodiment may have an initial connection resistance of 0.5Ω or less, as measured at 25° C. immediately after compressing and heating the anisotropic conductive film placed between a glass substrate and an Integrated circuit (IC) driver chip or an IC chip at 140° C. to 160° C. under a load of 60 MPa to 80 MPa for 3 to 7 seconds. For example, the anisotropic conductive film may have an initial connection resistance of 0.1Ω or less, or 0.05Ω or less.

Within this range of the initial connection resistance, the anisotropic conductive film may prevent signal interference of fine pitch electrodes.

By way of example, the connection resistance of the anisotropic conductive film may be measured, for example, by the following method. The anisotropic conductive film may be connected to a semiconductor device under pre-compression conditions of 60° C., 1 second and a load of 1.0 MPa and under primary compression conditions of 150° C., 5 seconds and 70 MPa to prepare 10 specimens for each condition. Then, connection resistance of each of the specimens may be measured by applying an electric current of 1 mA using a resistant tester (Hioki Co., Ltd.), and an average value of the initial connection resistances may be calculated.

For example, the anisotropic conductive film may be subjected to pre-compression at 55° C. to 65° C. under a load of 1.0 MPa to 2.0 MPa for 1 to 2 seconds and subjected to primary compression at 145° C. to 155° C. under a load of 65 MPa to 75 MPa for 4 to 6 seconds.

The anisotropic conductive film according to an embodiment may have a post-reliability testing connection resistance of 5Ω or less, as measured after the anisotropic conductive film is subjected to compressing and heating under the aforementioned conditions and left at 85° C. and 85% RH for 500 hours. For example, the anisotropic conductive film may have a post-reliability testing connection resistance of 4Ω or less; or 3Ω or less, for example, 2Ω or less, or 1Ω or less.

Within this range, the anisotropic conducive film may maintain low connection resistance even under high temperature and high humidity conditions, and connection reliability may be improved. A semiconductor device connected by the anisotropic conductive film according to an embodiment may be used for a long time under high temperature and high humidity conditions.

By way of example, post-reliability testing connection resistance of the anisotropic conductive film may be measured, for example, by the following method. The anisotropic conductive film may be subjected to compressing and heating (pre-compression and primary compression) under measurement conditions of the initial connection resistance, and left at 85° C. and 85% RH for 500 hours to perform high temperature/high humidity reliability testing. Then, connection resistance of each of specimens may be measured and an average value of the connection resistances may be calculated.

Hereinafter, each of layers of the anisotropic conductive film according to an embodiment will be described in detail. Each of the layers of the anisotropic conductive film may include a binder resin, an epoxy resin, a curing agent, inorganic particles, and a coupling agent, wherein the conductive layer may further include conductive particles.

For example, the binder resin, the epoxy resin, the curing agent, the inorganic particles and the coupling agent commonly included in the respective layers will be described in detail.

Binder Resin

In embodiments, any binder resin used in the art may be used.

Examples of the binder resin include polyimide resins, polyamide resins, phenoxy resins, polymethacrylate resins, polyacrylate resins, polyurethane resins, polyester resins, polyester urethane resins, polyvinyl butyral resin, styrene-butadiene-styrene (SBS) resins and epoxylated modifications thereof, styrene-ethylene-butylene-styrene (SEBS) resins and modifications thereof, acrylonitrile butadiene rubber (NBR) or hydrogenated compounds thereof, and combinations thereof.

For example, binder resins having different weight average molecular weights (Mw) and belonging to the same kind of binder resin may be used, and two or more kinds of binder resins having the same weight average molecular weight may be used.

In the first insulation layer, the binder resin may be present in an amount of 10% by weight (wt %) to 60 wt %, for example, 20 wt % to 50 wt %, based on the total weight of the first insulation layer in terms of solid content.

In the conductive layer, the binder resin may be present in an amount of 10 wt % to 50 wt %, for example, 10 wt % to 40 wt %, based on the total weight of the conductive layer in terms of solid content.

In the second insulation layer, the binder resin may be present in an amount of 10 wt % to 50 wt %, for example, 10 wt % to 40 wt %, based on the total weight of the second insulation layer in terms of solid content.

For example, the second insulation layer may contain a first binder resin and a second binder resin having different glass transition temperatures. The first binder resin may have a higher glass transition temperature (Tg) than the second binder resin. The first binder resin may have a glass transition temperature of 90° C. or higher, for example, 95° C. or higher, and the second binder resin may have a glass transition temperature of less than 90° C., for example, from 60° C. to less than 90° C., for example, from 70° C. to less than 90° C., for example, from 70° C. to 80° C. Hardness of the film composition may increase with increasing glass transition temperature of the binder resins.

The second insulation layer according to an embodiment may include the same or greater amount of the first binder resin than that of the second binder resin, and the weight ratio of the first binder resin to the second binder resin may range from 1:0.2 to less than 1:1. The second insulation layer according to an embodiment may include a lower amount of the first binder resin than that of the second binder resin, and the weight ratio of the first binder resin to the second binder resin may range from 1:4 to 1:10.

Within these ranges of the binder resins, the corresponding layers may have improved flowability and the anisotropic conductive film may exhibit suitable adhesion upon pre-compression. It may be possible to adjust melt viscosity of the second insulation layer according to the weight ratio of the binder resins in the second insulation layer.

Epoxy Resin

The epoxy resin may include at least one of epoxy monomers selected from the group consisting of bisphenol type, novolac type, glycidyl type, aliphatic and alicyclic epoxy monomers, epoxy oligomers thereof, and epoxy polymers thereof. As for the epoxy resin, any material that includes, for example, at least one coupling structure selected from bisphenol type, novolac type, glycidyl type, aliphatic and alicyclic epoxy molecules, may be used.

An epoxy resin having a solid phase at room temperature and an epoxy resin having a liquid phase at room temperature may be used together. A flexible epoxy resin may also be used together. Examples of the epoxy resin having a solid phase at room temperature may include phenol novolac type epoxy resins, cresol novolac type epoxy resins, dicyclopentadiene-containing epoxy resins, and bisphenol A or F type polymer or modified epoxy resins.

Examples of the epoxy resin having a liquid phase at room temperature include bisphenol A or F type epoxy resins and combinations thereof.

Examples of the flexible epoxy resin may include dimer acid-modified epoxy resins, propylene glycol-containing epoxy resins, and urethane-modified epoxy resins.

The aromatic epoxy resin may be selected, for example, from the group consisting of naphthalene, anthracene, and pyrene resins.

The epoxy resin used in the anisotropic conductive film according to an embodiment may include an epoxy resin that is substituted by a hydroxyl group. The epoxy resin substituted by a hydroxyl group may include a hydrogenated bisphenol A type epoxy monomer represented by Formula 1 or a hydrogenated bisphenol A type epoxy oligomer represented by Formula 2.

[Formula 1]

[Formula 2]

For example, in Formula 2, n is an integer from 1 to 50.

In the first insulation layer, the epoxy resin may be present in an amount of 20 wt % to 70 wt %, for example, 30 wt % to 70 wt %, for example, 40 wt % to 60 wt %, based on the total weight of the first insulation layer in terms of solid content.

In the conductive layer, the epoxy resin may be present in an amount of 1 wt % to 30 wt %, for example, 1 wt % to 20 wt %, based on the total weight of the conductive layer in terms of solid content.

In the second insulation layer, the epoxy resin may be present in an amount of 10 wt % to 60 wt %, for example, 20 wt % to 60 wt %, for example, 30 wt % to 50 wt %, based on the total weight of the second insulation layer in terms of solid content.

For example, in the second insulation layer, the content of the epoxy resin may be higher than the content of the binder resin based on the total weight of the second insulation layer in terms of solid content. In the second insulation layer, the weight ratio of the epoxy resin to the binder resin may be higher than 1:1 and less than or equal to 2:1, for example, 1.1:1 to 1.95:1, or 1.2:1 to 1.9:1.

Within these ranges of the epoxy resin in the respective layers, the anisotropic conductive film may secure excellent film formation and adhesion, and may exhibit suitable melt viscosity for pre-compression such that the film may be evenly compressed on the glass substrate upon pre-compression. The anisotropic conductive film may improve insulation reliability by compensating for insufficient filling of a single insulation layer.

Curing Agent

Any curing agent capable of curing epoxy resins may be used. Examples of the curing agent include acid anhydride curing agents, amine curing agents, imidazole curing agents, isocyanate curing agents, amide curing agents, hydrazide curing agents, phenol curing agents, cationic curing agents, and combinations thereof.

According to an embodiment, the curing agent may be a cationic curing agent, for example, ammonium/antimony hexafluoride.

The curing agent may be used as a mixture with the epoxy resin at room temperature, and the curing agent may exhibit no reactivity with the epoxy resin at room temperature and have activity at a predetermined temperature or higher to exhibit properties of the curing agent through active reaction with the epoxy resin.

Any cationic curing agent capable of generating cationic ions with thermal activation energy may be used. For example, a cationic latent curing agent may be used.

Examples of the cationic latent curing agent may include onium salt compounds, such as aromatic diazonium salts, aromatic sulfonium salts, aliphatic sulfonium salts, aromatic iodonium salts, phosphonium salts, pyridinium salts, and selenium salts; compound complexes, such as metal arene complexes, and silanol/aluminum complexes; and compounds containing a tosylate group such as benzoin tosylates, and o-nitrobenzyl tosylates, to provide a function of capturing electrons.

For example, sulfonium salt compounds having high efficiency in generation of cationic ions, such as aromatic sulfonium salt compounds or aliphatic sulfonium salt compounds, may be used.

Such a cationic latent curing agent may form a salt structure, and hexafluoroantimonate, hexafluorophosphate, tetrafluoroborate, or pentafluorophenyl borate, may be used as counter ions in formation of a reactive side salt.

In the first insulation layer, the curing agent may be present in an amount of 0.1 wt % to 10 wt %, for example, 1 wt % to 10 wt %, based on the total weight of the first insulation layer in terms of solid content.

In the conductive layer, the curing agent may be present in an amount of 0.5 wt % to 10 wt %, for example, 1 wt % to 10 wt %, based on the total weight of the conductive layer in terms of solid content.

In the second insulation layer, the curing agent may be present in an amount of 0.5 wt % to 10 wt %, for example, 1 wt % to 10 wt %, based on the total weight of the second insulation layer in terms of solid content.

Within this range, the curing agent may permit sufficient formation of an acrylate cured structure in the overall cured product, may prevent excessive increase in hardness of the cured product to prevent deterioration in interface peeling force and adhesion, and may prevent deterioration in stability and reliability, for example, due to the remaining curing agent.

According to an embodiment, the conductive layer may further include inorganic particles and conductive particles.

Inorganic Particles

According to an embodiment, the conductive layer may include inorganic particles, for example, to adjust flowability of the conductive layer. Examples of the inorganic particles include silica ($SiO_2$), $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, and $In_2O_3$.

For example, silica may be used as the inorganic particles. The silica may include, for example, silica prepared by a liquid phase process such as, for example, sol-gel processing or sedimentation; silica prepared by a vapor phase process such as, for example, flame oxidation; non-powdery silica obtained from silica gel without pulverization; fumed silica; fused silica; and combinations thereof. The silica particles may have, for example, a spherical shape, a flake shape, an edgeless shape, or combinations thereof.

Also, the first and the second insulation layer may include inorganic particles, as well.

In the first insulation layer, the silica particles may be present in an amount of 1 wt % to 30 wt %, for example, 1 wt % to 20 wt %, based on the total weight of the first insulation layer in terms of solid content.

In the conductive layer, the silica particles may be present in an amount of 1 wt % to 30 wt %, for example, 1 wt % to 20 wt %, based on the total weight of the conductive layer in terms of solid content.

In the second insulation layer, the silica particles may be present in an amount of wt % to 40 wt %, for example, 10 wt % to 40 wt %, based on the total weight of the second insulation layer in terms of solid content.

Flowability of the conductive layer may be adjusted through adjustment of the melt viscosity thereof based on the amount of silica particles within this range.

If the silica particles have a larger particle size (average particle size) than the conductive particles, there may be a problem with electrical conductivity. For example, the silica particles included in the conductive layer may have an average particle size from 5 nm to 20 nm.

As the respective layers contain the silica particles within these ranges of content and average particle size, the anisotropic conductive film may secure sufficient flowability through adjustment of melt viscosity to allow a space between the electrode terminals to be sufficiently filled with the conductive layer, and may have improved insulation reliability, for example, due to insulating properties of the inorganic particles.

According to an embodiment, the conductive layer of the anisotropic conductive film may further include conductive particles.

Conductive Particles

The conductive particles may be included in the conductive layer, for example, to improve electrical conductivity between the terminals, and any conductive particles may be used.

Examples of the conductive particles may include metal particles such as gold (Au), silver (Ag), nickel (Ni), copper (Cu), and solder particles; carbon particles; resin particles, such as polyethylene, polypropylene, polyester, polystyrene, polyvinyl alcohol and modified resin particles thereof coated with metals, such as gold (Au), silver (Ag), and nickel (Ni); insulated conductive particles obtained, for example, by further coating insulating particles onto the metal-coated polymer resin particles; and combinations thereof.

The average particle size of the conductive particles may be selected within the range of 1 μm to 20 μm depending upon the pitch of circuits to be used and upon the purpose thereof. For example, the conductive particles may have an average particle size of 1 μm to 10 μm.

In some embodiments, in the conductive layer of the anisotropic conductive film, the conductive particles may be present in an amount of 20 wt % to 70 wt %, for example, 30 wt % to 60 wt %, based on the total weight of the conductive layer in terms of solid content.

Within these ranges of average particle size and content, the conductive particles may be easily compressed between the terminals to secure stable connection reliability and may reduce connection resistance by improving electrical conductivity.

The respective layers of the anisotropic conductive film according to an embodiment may further include a silane coupling agent, for example, to enhance adhesion resulting from chemical coupling between the surfaces of the inorganic particles and the organic binder resin.

Coupling Agent

Any coupling agent may be used. For example, a silane coupling agent may be used. Examples of the silane coupling agent include: epoxy group-containing silane coupling agents, such as 2-(3,4-epoxycyclohexyl)-ethyltrimethoxysilane, 3-glycidoxytrimethoxysilane, and 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine and N-phenyl-3-aminopropyltrimethoxysilane; mercapto-containing silane coupling agents, such as 3-mercaptopropylmethyldimethoxysilane and 3-mercaptopropyltriethoxysilane; isocyanate-containing silane coupling agents, such as 3-isocyanatepropyltriethoxysilane; and mixtures thereof.

For example, in the first insulation layer, the silane coupling agent may be present in an amount of 0.1 wt % to 10 wt %, for example, 0.1 wt % to 5 wt %, based on the total weight of the first insulation layer in terms of solid content.

In the conductive layer, the silane coupling agent may be present in an amount of 0.1 wt % to 10 wt %, for example, 0.1 wt % to 7 wt %, based on the total weight of the conductive layer in terms of solid content.

In the second insulation layer, the silane coupling agent may be present in an amount of 0.1 wt % to 10 wt %, for example, 0.1 wt % to 5 wt %, based on the total weight of the second insulation layer in terms of solid content.

Within this content range of the coupling agent, the anisotropic conductive film may exhibit excellent bonding reliability.

In some embodiments, the conductive layer, the first insulation layer and the second insulation layer of the anisotropic conductive film may further include other additives, for example, to impart additional properties to the anisotropic conductive film without deteriorating fundamental properties thereof.

Other Additives

The anisotropic conductive film may further include additives such as, for example, polymerization inhibitors, tackifiers, antioxidants, heat stabilizers, and curing accelerators. The amounts of these additives may be determined in various ways depending upon the purpose and desired effects of the film.

Any method of preparing the anisotropic conductive film according to embodiments may be used.

No special apparatus or equipment is required to form the anisotropic conductive film. For example, the anisotropic conductive film may be prepared by dissolving a binder resin in an organic solvent, adding other components to the binder resin, stirring the components for a predetermined period of time, applying the mixture to a suitable thickness of, for example, 10 μm to 50 μm, onto a release film, and drying the mixture for a sufficient time to volatilize the organic solvent, and an anisotropic conductive film having a monolayer structure may be provided.

Any organic solvent may be used. In an embodiment, the aforementioned procedure may be repeated twice or more, and an anisotropic conductive film having a multilayer structure may be provided.

Figure 8:
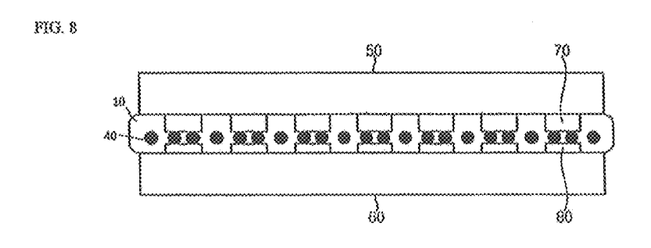
FIG. 8 illustrates a sectional view of a semiconductor device according to an embodiment.

For example, a semiconductor device according to an embodiment will be described with reference to FIG. 8. The semiconductor device may include a first connecting member 50 having a first electrode 70; a second connecting member 60 having a second electrode 80; and an anisotropic conductive film 10 disposed between the first connecting member 50 and the second connecting member 60 and electrically connecting the first electrode 70 to the second electrode 80 via conductive particles 40.

The anisotropic conductive film 10 may be an anisotropic conductive film according to other embodiments.

For example, in the semiconductor device according to an embodiment, the anisotropic conductive film 10 may be placed and compressed between the first connecting member 50 having the first electrode 70 and the second connecting member 60 having the second electrode 80, and the first electrode 70 and the second electrode 80 may be connected to each other via the conductive particles 40.

In an embodiment, the first and second connecting members may have similar structures in terms of material, thickness, size and interconnectivity. The first and second connecting members may have a thickness of about 20 μm to about 100 μm.

In another embodiment, the first and second connecting members may have different structures and functions in terms of material, thickness, size and interconnectivity.

The first connecting member or the second connecting member may be formed of, for example, IC chip, driver-IC, glass, PCB (Printed Circuit Board), fPCB (flexible Printed Circuit Board), COF (Chip On Film), TCP (Tape Carrier Package), and ITO (indium tin oxide) glass. The first electrode or the second electrode may be a protruding electrode or a flat electrode. The first and second electrodes may be protruding electrodes, and the first and second electrodes may have a height (H) of about 2.50 μm to about 10 μM, a width (W) of about 50 μm to about 120 μm, and a gap (G) between electrodes of about 50 μm to about 110 μm.

For example, the electrodes have a height (H) of about 2.50 μm to about 9 μm, a width (W) of about 50 μm to about 100 μm, and a gap (G) of about 60 μm to about 100 μm.

The first and second electrodes may be protruding electrodes, and the first and second electrodes may have a height (H) of about 500 Å to about 1200 Å.

The first electrode or the second electrode may be formed of, for example, ITO, copper, silicon, and IZO (Indium Zinc Oxide).

For example, the flat electrodes may have a thickness of 800 Å to 1200 Å, and the protruding electrodes may have a height of 6 μm to 10 μm. The insulation layer may have a thickness of 4 μm to 12 μm to exhibit sufficient adhesion. For example, the flat electrodes may have a thickness of 1000 Å and the protruding electrodes may have a height of 8 μm. The insulation layer may have a thickness of 6 μm to 10 μm.

Any suitable method may be used to fabricate a semiconductor device according to embodiments.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE AND COMPARATIVE EXAMPLE

A first insulation layer, a conductive layer and a second insulation layer were prepared as listed in Table 1. The components in each layer are represented in units of wt %.

TABLE 1

|  |  |  | Example | | | Comparative Example | | | |
|---|---|---|---|---|---|---|---|---|---|
|  |  |  | 1 | 2 | 3 | 1 | 2 | 3 | 4 |
| First insulation layer | Binder | First binder | 30 | 30 | 30 | 30 | 30 | 30 | 30 |
|  | Epoxy | First epoxy | 23 | 23 | 23 | 23 | 23 | 23 | 23 |
|  |  | Second epoxy | 30 | 30 | 30 | 30 | 30 | 30 | 30 |
|  | Curing agent | Latent curing agent | 5 | 5 | 5 | 5 | 5 | 5 | 5 |
|  | Inorganic particles | silica | 10 | 10 | 10 | 10 | 10 | 10 | 10 |
|  | Coupling agent |  |  | 2 | 2 | 2 | 2 | 2 | 2 |
| Conductive layer | Binder | First binder | 30 | 30 | 30 | 30 | 30 | 30 | 30 |
|  | Epoxy | Second epoxy | 10 | 10 | 10 | 10 | 10 | 10 | 10 |
|  | Curing agent | Latent curing agent | 5 | 5 | 5 | 5 | 5 | 5 | 5 |
|  | Inorganic particles | Silica | 10 | 10 | 10 | 10 | 10 | 10 | 10 |
|  | Conductive particles |  |  | 42 | 42 | 42 | 42 | 42 | 42 |
|  | Coupling agent |  |  | 3 | 3 | 3 | 3 | 3 | 3 |
| Second insulation layer | Binder | First binder | 20 | 5 | 3 | 24 | 25 | 4 | 5 |
|  |  | Second binder | 5 | 20 | 27 | 4 | 0 | 15 | 18 |
|  | Epoxy | First epoxy | 9 | 8 | 10 | 6 | 6 | 30 | 18 |
|  |  | Second epoxy | 38 | 34 | 28 | 34 | 36 | 20 | 23 |
|  | Coupling agent |  |  | 2 | 2 | 2 | 2 | 2 | 2 |
|  | Curing agent | Latent curing agent | 3 | 3 | 3 | 3 | 3 | 3 | 3 |
|  | Inorganic particles | Silica | 23 | 28 | 27 | 27 | 28 | 26 | 31 |

First binder resin: Bisphenol A phenoxy resin (Mitsubishi Co., Ltd., Product Name: E1256, Tg: 98° C., weight average molecular weight (MW): 50,000 g/mol)
Second binder resin: Bisphenol A/F phenoxy resin (Mitsubishi Co., Ltd., Product Name: E4275, Tg: 75° C., weight average molecular weight (MW): 60,000 g/mol)
First epoxy resin: Propylene oxide-based epoxy resin (Adeka Corporation, Product Name: EP-4000S)
Second epoxy resin: Propylene oxide-based epoxy resin (Adeka Corporation, Product Name: EP-4010S)
Curing agent: Cationic curing agent (Samshin Chemical Co., Ltd., Product name: SI-60L)
Inorganic particles: 7 nm silica (Degussa GmbH, Product name: R812)
Conductive particles: 3 μm conductive particles (Sekisui Chemical Co., Ltd., Product name: AUL704)
Coupling agent: Silane coupling agent (Shin-Etsu Co., Ltd., Product Name: KBM403)

Example 1

Preparation of First Insulation Layer Composition 30 wt % of the first binder resin (Mitsubishi Co., Ltd, Product name: E1256), 23 wt % of the first epoxy resin (Adeka Corporation, Product Name: EP-4000S), and 30 wt % of the second epoxy resin (Adeka Corporation, Product Name: EP-4010S) were mixed and stirred for 5 minutes using a C-mixer. Next, after 5 wt % of the cationic curing agent (Samshin Chemical Co., Ltd., Product name: SI-60L) was added to the mixture, 7 nm silica (Degussa GmbH, Product name: R812) and the silane coupling agent (Shin-Etsu Co., Ltd., Product Name: KBM403) were further added to the mixture, followed by stirring for 1 minute using the C-mixer (such that the temperature of the mixture did not exceed 60° C.), thereby forming a first insulation layer composition.

Preparation of Conductive Layer Composition

A conductive layer composition was prepared in the same manner as in the preparation of the first insulation layer composition except that the amounts of the binder resin, the epoxy resin, the curing agent, the silica particles and the coupling agent were adjusted as in Table 1, and 3 μm conductive particles (AUL704, Sekisui Chemical Co., Ltd.) were added.

Preparation of Second Insulation Layer Composition

A second insulation layer composition was prepared in the same manner as in the preparation of the first insulation layer composition except that the amounts of the binder resin, the epoxy resin, the curing agent, the silica particles and the coupling agent were adjusted as in Table 1.

Preparation of Anisotropic Conductive Film

The first insulation layer composition was coated onto one surface of a polyethylene terephthalate release film and dried with hot air at 70° C. for 5 minutes to form a 1.0 μm thick first insulation layer on a 1.0 μm thick base film.

Then, a 4 μm thick conductive layer was formed on the first insulation layer using the conductive layer composition, and a 12 μm thick second insulation layer was formed on the conductive layer using the second insulation layer composition, thereby preparing an anisotropic conductive film.

Example 2

An anisotropic conductive film was prepared in the same manner as in Example 1 by adjusting the amounts of the respective components in the second insulation layer as listed in Table 1.

Example 3

An anisotropic conductive film was prepared in the same manner as in Example 1 by adjusting the amounts of the respective components in the second insulation layer as listed in Table 1.

Comparative Example 1

An anisotropic conductive film was prepared in the same manner as in Example 1 by adjusting the amounts of the respective components in the second insulation layer as listed in Table 1.

Comparative Example 2

An anisotropic conductive film was prepared in the same manner as in Example 1 by adjusting the amounts of the respective components in the second insulation layer as listed in Table 1.

Comparative Example 3

An anisotropic conductive film was prepared in the same manner as in Example 1 by adjusting the amounts of the respective components in the second insulation layer as listed in Table 1.

Comparative Example 4

An anisotropic conductive film was prepared in the same manner as in Example 1 by adjusting the amounts of the respective components in the second insulation layer as listed in Table 1.

Table 2 shows the ratios of binder resins in the second insulation layers of Examples and Comparative Examples.

TABLE 2

|  | Example | | | Comparative Example | | | |
| --- | --- | --- | --- | --- | --- | --- | --- |
| Weight ratio | 1 | 2 | 3 | 1 | 2 | 3 | 4 |
| First binder:Second binder | 1:0.25 | 1:4 | 1:9 | 1:0.17 | 1:0 | 1:3.75 | 1:3.6 |
| Binder:Epoxy | 1:1.88 | 1:1.68 | 1:1.27 | 1:1.43 | 1:1.68 | 1:2.63 | 1:1.78 |

Experimental Example 1

Measurement of Lowest Melt Viscosity

The lowest melt viscosity at 60° C. was measured on a 150 μm thick sample using an ARES G2 rheometer (TA Instruments) while increasing the temperature of the sample at a temperature elevation rate of 10° C./min and a frequency of 10 rad/second in a temperature zone from 30° C. to 200° C. Measurement results are shown in Table 3.

TABLE 3

|  | Example | | | Comparative Example | | | |
| --- | --- | --- | --- | --- | --- | --- | --- |
|  | 1 | 2 | 3 | 1 | 2 | 3 | 4 |
| Melt viscosity of second insulation layer (Pa · s @ 60° C.) | 36000 | 23000 | 22500 | 106000 | 128000 | 6600 | 5100 |
| Melt viscosity of ACF (Pa · s @ 60° C.) | 47000 | 30600 | 29000 | 130000 | 168200 | 9000 | 6800 |

Experimental Example 2

Measurement of Stress-Strain Curve, Slope (A), Maximum Stress ($S_{max}$) and Strain (D) Upon Fracture of the Sample A slope (A) and maximum stress of a stress-strain curve of each of the anisotropic conductive films prepared in Examples and Comparative Examples were measured as follows.

With film specimens cut to a size of 2 mm×10 mm by hand slitting and mounted on a universal testing machine (UTM, H5KT, Hounsfield), tensile strength of the film specimen was measured twice for each specimen. Then, average tensile strength was calculated to obtain a stress-strain curve.

On the stress-strain curve, maximum stress ($S_{max}$)(kgf/mm$^2$) was measured and variation from coordinates (x, ½ $S_{max}$) indicating 50% of the maximum stress ($S_{max}$) to coordinates (0, $S_0$) at a strain of 0 was obtained to calculate the slope (A) (unit: kgf/(mm$^2$·%)) according to Equation 1, $$\text{Slope}(A, \text{unit:kgf}/(\text{mm}^2 \cdot \%)) = (½S_{max} - S_0)/x \quad (1)$$

wherein $S_{max}$: maximum stress, x: strain (%) at half (½) of the maximum stress, and $S_0$: stress at a strain of 0.

In the following Table 2, (x, y) maximum stress ($S_{max}$), strain (D) upon fracture of the sample, and the slope (A, unit: kgf/(mm$^2$·%)) of the stress-strain curve indicating variation from coordinates (x, ½ $S_{max}$) indicating 50% of maximum stress ($S_{max}$) to coordinates (0, $S_0$) at a strain of 0 are shown.

Experimental Example 3

Evaluation of Pre-Compression Failure

Evaluation of pre-compression failure of each of the anisotropic conductive films prepared in Examples and Comparative Examples was performed as follows.

Figure 6:
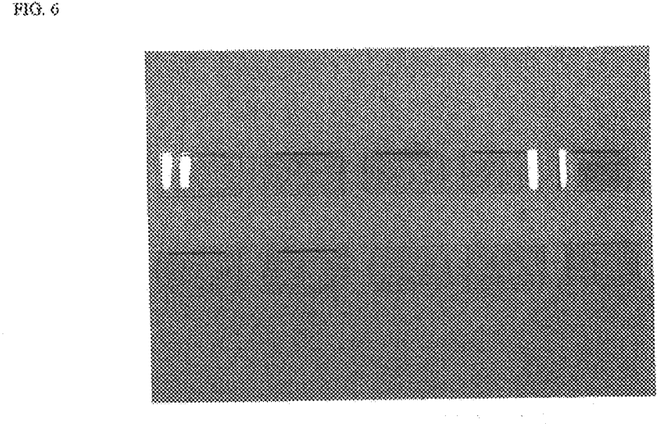
FIG. 6 illustrates a picture showing samples of Comparative Example 3, in which three samples did not show lines and were insufficiently pre-compressed in evaluation of pre-compression failure.
Figure 7:
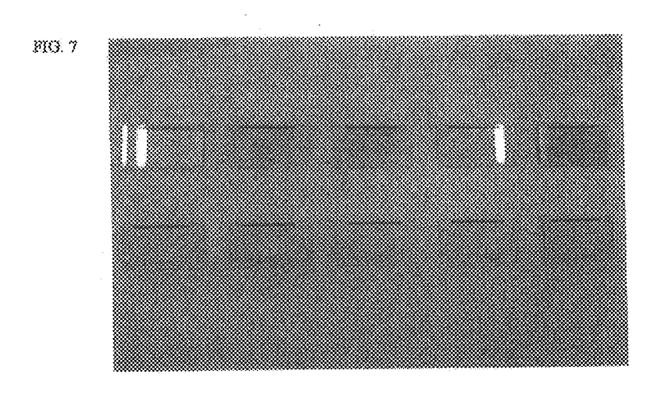
FIG. 7 illustrates a picture showing samples of Example 1, in which all samples showed lines and had good results in evaluation of pre-compression failure.

Upon pre-compression at 60° C. under a load of 1 MPa for 1 second on a 0.5T glass substrate coated with a 2000 Å thick ITO layer, a sample showing no line (see FIG. 6) was evaluated as "poor" and a sample showing a line was evaluated as "good" (see FIG. 7). Then, the number of samples evaluated as "good" was counted to determine pre-compression failure.

Experimental Example 4

Measurement of Connection Resistance

Connection resistance of each of the anisotropic conductive films prepared in Example and Comparative Example was measured as follows.

As an adherend member, a glass substrate having a 1200 μm IC chip of a bump area of 1200 μm and a 2000 Å thick indium tin oxide (ITO) circuit was used. After pre-compression at 60° C. under a load of 1 MPa for 1 second, the anisotropic conductive film was placed between adherend members and subjected to primary compression at 150° C. under a load of 70 MPa for 5 seconds, thereby preparing samples.

Resistance of each of the samples was measured using a resistant tester (Hioki Hitester) by applying an electric current of 1 mA.

Experimental Example 5

Measurement of Post-Reliability Testing Connection Resistance

Post-reliability testing connection resistance of each of the anisotropic conductive films prepared in Example and Comparative Example were measured as follows.

After compression under conditions of Experimental Example 4, the anisotropic conductive films were left at 85° C. and 85% RH for 500 hours to evaluate reliability under high temperature and high humidity conditions. Then, connection resistance of each of the anisotropic conductive films was measured in the same manner as in Experimental Example 4.

Measurement results of Experimental Examples 2 to 5 are shown in Table 4.

rated as "good" in pre-compression failure testing, and exhibited good pre-compression properties. The anisotropic conductive films also had an initial connection resistance of 0.5Ω or less and a post-reliability testing connection resistance of 5Ω or less, and exhibited good connection resistance even under high temperature and high humidity conditions.

On the contrary, when the anisotropic conductive films did not satisfy one of the slope and maximum stress conditions, the anisotropic conductive films had at least three to 6 "poor" samples in pre-compression failure testing, and exhibited increase in initial and post-reliability testing connection resistance.

The anisotropic conductive films according to Examples 1-3 had good pre-compression properties and also exhibited good connection reliability even under high temperature and high humidity conditions after primary compression, and the anisotropic conductive films according to Examples 1-3 could be used for a long time even under high temperature and high humidity conditions when applied to a semiconductor device.

By way of summation and review, an anisotropic conductive film may be placed between circuit boards and may be subjected to thermal compression under certain conditions, circuit terminals of the circuit boards may be electrically connected to each other through conductive particles and an insulation layer may fill spaces between adjacent circuit terminals, for example, to isolate the conductive particles from other, and high insulation and conductivity between the circuit terminals may be provided.

In a modulation process using the anisotropic conductive film, the anisotropic conductive film may be aligned on a glass substrate and then subjected to pre-compression in which the anisotropic conductive film may be secured to the glass substrate through thermal compression, and may be followed by removal of a release film. Melt viscosity of a conductive layer secured to the glass substrate may be higher than that of an insulation layer near the release film, the conductive layer may exhibit low adhesion to the glass substrate, and pre-compression failure, by which the anisotropic conductive film may be completely detached from the glass substrate instead of remaining thereon upon removal of the release film, may be caused.

TABLE 4

| | Stress-strain curve | | | | Pre-compression property (Good/total sum) | Connection resistance (Ω) | |
|---|---|---|---|---|---|---|---|
| | $S_{max}$ (kgf/mm$^2$) | D (%) | X | ½ $S_{max}$ | Slope (A) kgf/ (mm$^2$·%) | | Initial | After reliability testing |
| Example 1 | 0.88 | 28.8 | 2.68 | 0.44 | 0.16 | 10/10 | 0.03 | 0.39 |
| Example 2 | 0.78 | 115 | 2.13 | 0.39 | 0.18 | 10/10 | 0.04 | 0.72 |
| Example 3 | 0.92 | 122.85 | 2.90 | 0.46 | 0.16 | 10/10 | 0.04 | 0.48 |
| Comparative Example 1 | 1.3 | 4.93 | 1.91 | 0.65 | 0.34 | 5/10 | 0.12 | 9.72 |
| Comparative Example 2 | 0.97 | 4.01 | 1.97 | 0.49 | 0.25 | 7/10 | 0.11 | 8.31 |
| Comparative Example 3 | 0.38 | 85.85 | 2.60 | 0.19 | 0.07 | 3/10 | 0.09 | 9.03 |
| Comparative Example 4 | 0.28 | 23.55 | 1.83 | 0.14 | 0.07 | 4/10 | 0.11 | 16.13 |

Referring to Table 4, when the slope was in the range of greater than 0 to 0.2 kgf/(mm$^2$·%) and the maximum stress ($S_{max}$) was 0.4 kgf/mm$^2$ or more (Example 1 to 3) in the stress-strain curve, the anisotropic conductive films were An anisotropic conductive film of tri-layer structure may solve such a problem. However, the anisotropic conductive film of tri-layer structure may adopt a thick insulation layer, for example, to secure pre-compression properties of the insulation layer, and there may be a problem of insufficient connection reliability, for example, detachment of the conductive film after curing.

Upon generation of failure in primary compression, the anisotropic conductive film may be subjected to manual pre-compression after removing a tap through a rework process instead of disposal of the glass substrate, and the anisotropic conductive film may require high pre-compression properties.

The anisotropic conductive film may be subjected to stress, for example, due to pressure upon pre-compression. External stress applied to the anisotropic conductive film may exceed allowable maximum stress, the anisotropic conductive film may fail to relieve internal stress generating cracks, and deterioration in properties such as, for example, adhesion, and fracture of the anisotropic conductive film may be caused. Pre-compression may be performed at reduced pressure, and there may be problems in that the film may be elongated and the pre-compression properties of the film may be deteriorated.

Provided is a method that may be capable of controlling pre-compression properties of a film before curing, an anisotropic conductive film that may have improved shape stability and reel stability by enhancing pre-compression processability while facilitating primary compression through adjustment of the pre-compression properties, and a semiconductor device connected by such an anisotropic conductive film.

According to embodiments, adjusting the slope and maximum stress of the stress-strain curve may allow control of the pre-compression properties, may provide improved connection reliability, for example, by reducing detachment after curing, and may secure sufficient conductivity and cohesion to a substrate. Embodiments may also provide a semiconductor device connected by the anisotropic conductive film which may have improved post-reliability testing connection resistance, and long lifespan under high temperature and high humidity conditions may be secured.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising
an anisotropic conductive film connecting the semiconductor device, the anisotropic conductive film having:
a maximum stress of 0.4 kgf/mm² or more; and
a stress-strain curve having a slope (A) of greater than 0 and less than or equal to 0.2 kgf/(mm²·%) as represented by the following equation 1:

$$\text{slope}(A) = (\tfrac{1}{2} S_{max} - S_0)/x \qquad (1),$$

wherein:
$S_{max}$=maximum stress,
x=strain (%) at half (½) of the maximum stress, and
$S_0$=stress at a strain of 0.

2. The semiconductor device as claimed in claim 1, wherein the anisotropic conductive film has a strain (D) of 10% or more upon fracture of a sample thereof.

3. The semiconductor device as claimed in claim 1, wherein the anisotropic conductive film includes a first insulation layer, a conductive layer, and a second insulation layer.

4. The semiconductor device as claimed in claim 3, wherein the first insulation layer is stacked on one surface of the conductive layer and the second insulation layer is stacked on the other surface of the conductive layer.

5. The semiconductor device as claimed in claim 3, wherein the first insulation layer has a thickness of 2 μm or less.

6. The semiconductor device as claimed in claim 3, wherein the conductive layer has a thickness of 2 μm to 10 μm and the second insulation layer has a thickness of 6 μm to 18 μm.

7. The semiconductor device as claimed in claim 3, wherein the second insulation layer has a melt viscosity at 50° C. to 60° C. from 10,000 Pa·s to 70,000 Pa·s, as measured by an ARES rheometer.

8. The semiconductor device as claimed in claim 3, wherein the second insulation layer includes a binder resin, an epoxy resin, inorganic particles, a curing agent, and a coupling agent.

9. The semiconductor device as claimed in claim 8, wherein the second insulation layer includes: 10 wt % to 50 wt % of the binder resin; 10 wt % to 60 wt % of the epoxy resin; 5 wt % to 40 wt % of the inorganic particles; 0.5 wt % to 10 wt % of the curing agent; and 0.1 wt % to 10 wt % of the coupling agent based on a total weight of the second insulation layer in terms of solid content.

10. The semiconductor device as claimed in claim 9, wherein, in the second insulation layer, the content of the epoxy resin is higher than the content of the binder resin based on a total weight of the second insulation layer in terms of solid content, and a weight ratio of the epoxy resin to the binder resin is higher than 1:1 and less than or equal to 2:1.

11. The semiconductor device as claimed in claim 9, wherein the binder resin includes a first binder resin having a glass transition temperature (Tg) of 90° C. or higher and a second binder resin having a glass transition temperature from 60° C. to less than 90° C.

12. The semiconductor device as claimed in claim 11, wherein the first binder resin is present in a greater amount than the second binder resin, and a weight ratio of the first binder resin to the second binder resin ranges from 1:0.2 to less than 1:1.

13. The semiconductor device as claimed in claim 11, wherein the first binder resin is present in a smaller amount than the second binder resin, and a weight ratio of the first binder resin to the second binder resin ranges from 1:4 to 1:10.

14. The semiconductor device as claimed in claim 1, wherein the anisotropic conductive film has an connection resistance of 0.5Ω or less, as measured at 25° C. immediately after pre-compressing the anisotropic conductive film placed between a glass substrate and an Integrated Circuit (IC) driver chip or an IC chip at 50 to 70° C. under a load of 1 to 3 MPa for 1 to 3 seconds and compressing at 140° C. to 160° C. under a load of 60 MPa to 80 MPa for 3 to 7 seconds.

15. The semiconductor device as claimed in claim 14, wherein the anisotropic conductive film has a post-reliability testing connection resistance of 5Ω or less, as measured after the anisotropic conductive film is subjected to the pre-compression and the compression, and left at 85° C. and 85% RH for 500 hours.

16. The semiconductor device as claimed in claim 1, wherein the anisotropic conductive film has a melt viscosity at 50° C. to 60° C. from 20,000 Pa·s to 100,000 Pa·s, as measured by an ARES rheometer.

17. The semiconductor device as claimed in claim 3, wherein the first insulator layer has a different composition from the second insulating layer.

* * * * *